United States Patent [19]
Eidelloth et al.

[11] Patent Number: 5,646,095
[45] Date of Patent: Jul. 8, 1997

[54] SELECTIVE INSULATION ETCHING FOR FABRICATING SUPERCONDUCTOR MICROCIRCUITS

[75] Inventors: Walter Eidelloth, Yorktown Heights; William Joseph Gallagher, Ardsley, both of N.Y.

[73] Assignee: International Business Machines Corporation, Armonk, N.Y.

[21] Appl. No.: 318,576

[22] Filed: Oct. 5, 1994

Related U.S. Application Data

[63] Continuation of Ser. No. 154,673, Nov. 19, 1993, abandoned, which is a continuation of Ser. No. 716,889, Jun. 18, 1991, abandoned.

[51] Int. Cl.$^6$ .................................................. H01L 21/00
[52] U.S. Cl. .................... 505/330; 505/410; 505/413; 505/728; 216/13; 216/95; 216/101; 216/109
[58] Field of Search .................... 216/13, 16, 101, 216/95, 109; 505/728, 330, 410, 413

[56] References Cited

U.S. PATENT DOCUMENTS

| | | | |
|---|---|---|---|
| 4,980,338 | 12/1990 | Yamazaki | 505/1 |
| 4,988,670 | 1/1991 | Itozaki et al. | 505/1 |
| 4,996,191 | 2/1991 | Kobayashi et al. | 505/1 |
| 5,059,581 | 10/1991 | Vasquez | 505/728 X |

FOREIGN PATENT DOCUMENTS

| | | | |
|---|---|---|---|
| 57-123826 | 8/1982 | Japan | C01G 29/00 |
| 2-192402 | 7/1990 | Japan | C01B 13/14 |

OTHER PUBLICATIONS

B. Hauser et al. *Applied Physics Letters*, vol. 52, pp. 844–846 (7 Mar. 1988).
R. P. Vasquez et al. *Applied Physics Letters*, vol. 53, pp. 2692–2694 (26 Dec. 1988).
A. Tressaud et al., *Modern Physics Letters B*, vol. 2, pp. 1183–1188 (1988).
R. P. Vasquez et al., *Applied Physics Letters*, vol. 54, pp. 1060–1062 (13 Mar. 1989).
R. P. Vasquez et al. *Applied Physics Letters*, vol. 54, pp. 2373–2375 (5 Jun. 1989).
R. P. Vasquez et al., *Applied Physics Letters*, vol. 55, pp. 1801–1803 (23 Oct. 1989).
F. K. Shokoohi et al., *Applied Physics Letters*, vol. 55, pp. 2661–2663 (18 Dec. 1989).
Q. X. Jia and W. A. Anderson, *Journal of Materials Research*, vol. 4, pp. 1320–1325 (Nov./Dec. 1989).
J. J. Kingston et al., *Applied Physics Letters*, vol. 56, pp. 189–191 (8 Jan. 1990).
R. B. Laibowitz et al., *Applied Physics Letters*, vol. 56, pp. 686–688 (12 Feb. 1990).
Q. X. Jia and W. A. Anderson, *Journal of Applied Physics*, vol. 67, pp. 2528–2531 (1 Mar. 1990).
F. C. Wellstood et al., *Applied Physics Letters*, vol. 56, pp. 2336–2338 (4 Jun. 1990).
B. Oh et al., *Applied Physics Letters*, vol. 56, pp. 2575–2577 (18 Jun. 1990).
R. P. Vasquez et al., *Journal of the Electrochemical Society*, vol. 137, pp. 2344–2350 (Jul. 1990).
R. Gross et al., *Applied Physics Letters*, vol. 57, pp. 727–729 (13 Aug. 1990).
F. C. Wellstood et al., *Applied Physics Letters*, vol. 57, pp. 1930–1932 (29 Oct. 1990).
A. Tressaud et al., *European Journal of Solid State Inorganic Chemistry*, vol. 27, pp. 309–325 (1990).
P. Mankiewich et al., DARPA 2nd Annual High Temperature Superconductor Workshop, Danvers, MA, 3–5 Oct. 1990, pp. 149–164.
J. J. Kingston et al., *IEEE Transactions on Magnetics*, vol. 27, pp. 974–977 (Mar. 1991).
J. A. Beall et al., *IEEE Transactions on Magnetics*, vol. 27, pp. 1596–1599 (Mar. 1991).
W. G. Lyons et al., *IEEE Transactions on Magnetics*, vol. 27, pp. 2537–2539 (Mar. 1991).
Tanaka et al, "Observation of SrTiO$_3$–Ceramic Surface by Tunneling Spectroscopy", Nippon Seramikkusu Kyokai Gakujutsu Roobunshi (Japan Ceramic Association); vol. 97, No. 10, pp. 1164–1169, 1989 (Abstract).

*Primary Examiner*—Thi Dang
*Attorney, Agent, or Firm*—Daniel P. Morris

[57] ABSTRACT

A method for selectively etching insulative material composed of SrTiO3 or MgO in the presence of a copper oxide perovskite superconductive material includes treating the insulative material with a liquid selective etchant solution containing hydrogen fluoride in water for a period of time, the insulative material being etched at a substantially faster rate than the superconductive material etch rate, then treating the superconductive material exposed to the insulative selective with another etchant to remove a surface layer.

26 Claims, 7 Drawing Sheets

SELECTIVE INSULATION ETCHING FOR FABRICATING SUPERCONDUCTOR MICROCIRCUITS

This is a continuation of application Ser. No. 08/154,673, filed Nov. 19, 1993; now abandoned which is a continuation of application Ser. No. 07/716,889, filed Jun. 18, 1991, now abandoned.

FIELD OF THE INVENTION

The present invention concerns generally the fabrication of electronic devices from materials comprising superconductive materials and insulative materials, and more specifically concerns a process for fabrication of patterned elements of such electronic devices which involves etching insulative materials in the presence of high-$T_c$ copper oxide perovskite superconductive materials.

BACKGROUND ART

The recent development of copper-oxide perovskite superconductive materials having normal/superconductive critical transition temperatures ("$T_c$") significantly higher than previously known superconductive materials has spawned widespread interest in developing electronic devices which incorporate such perovskite superconductive materials and make use of superconductivity phenomena. The fabrication of semiconductor electronic devices which are generally planar in structure and comprise patterned layers of thin films of different materials is a well developed technology. It has been proposed to develop high-$T_c$ superconductive electronic devices which are generally planar in structure and comprise patterned layers of thin films of superconductive materials and insulative materials.

An article by Kingston et al. published in *IEEE Transactions, on Magnetics*, volume 27, pages 974–977 (March 1991) ("the Kingston et al. publication") disclosed a superconducting flux transformer fabricated as a thin-film $YBa_2Cu_3O_{7-x}$—$SrTiO_3$—$YBa_2Cu_3O_{7-x}$ multilayer structure. The flux transformer included what were termed "crossovers" and "window contacts." A "crossover" was described as superconducting thin film wires of $YBa_2Cu_3O_{7-x}$ separated by an electrically insulating layer of $SrTiO_3$. A "window contact" was described as a superconducting connection between two thin-film layers of superconducting $YBa_2Cu_3O_{7-x}$ made via a window opening patterned in an intervening layer of $SrTiO_3$. Each of the three layers of the flux transformer of the Kingston et al. publication was deposited by laser deposition and was patterned photolithographically by etching through a correspondingly patterned layer of developed photoresist. Films of $YBa_2Cu_3O_{7-x}$ were patterned by a standard photolithographic process using either a nitric acid solution or an argon ion mill to etch the film. According to the Kingston et al. publication, exposure of the surface of $YBa_2Cu_3O_{7-x}$ to the photoresist of the photolithographic process generally left a layer of contamination that often prevented epitaxial growth of subsequent layers. In addition, photolithography followed by an etch tended to produce sharp edges in the patterned $YBa_2Cu_3O_{7-x}$ film which tended to be difficult to insulate. It was indicated that both the problem of sharp edges and the problem of surface contamination by photoresist could be ameliorated by etching the patterned surface with a solution of bromine in methanol.

According to the Kingston et al. publication, to make a window contact through a layer of $SrTiO_3$ film which was sufficiently thick to be compatible with the crossovers of the flux transformer, the window opening had to have beveled walls. Such beveled walls in a window opening through an $SrTiO_3$ layer was formed by forming a window opening in a layer of photoresist on the $SrTiO_3$ layer which had sloping walls by a process which involved exposing the photoresist to an out-of-focus image of a window. The layer of $SrTiO_3$ was then etched through the window opening in the photoresist using an ion mill to cut through the $SrTiO_3$ layer to expose a lower layer of $YBa_2Cu_3O_{7-x}$. According to the Kingston et al. publication, too little etching with the ion mill left an insulating layer, while too much could could degrade the quality of the contact. It was determined when to terminate the ion milling by examination of the window under a microscope. To reduce damage to the exposed $YBa_2Cu_3O_{7-x}$, the ion milling was terminated by milling at a lower voltage for a few minutes. The bromine etch was not used after cutting the window through the $SrTiO_3$ layer because the bromine solution tended to remove $YBa_2Cu_3O_{7-x}$ under the $SrTiO_3$ layer.

Various etchants for Y—Ba—Cu—O films are noted in an article by Shokoohi et al. published in *Applied Physics Letters*, volume, 55, pages 2661–2663 (18 Dec. 1989). The use of solutions of phosphoric acid, nitric acid, and hydrochloric acid in water as acid etches in wet chemical etching was noted. It was disclosed that a saturated solution of ethylenediaminetetraacetic acid ("EDTA") in water was a suitable etch for use in standard photoresist lithography for microfabrication of superconducting devices. According to the publication, the EDTA solution readily removed Y—Ba—Cu—O, leaving substrate material intact.

An article by Jia and Anderson published in the *Journal of Materials Research*, volume 4, pages 1320–1325 (November/December 1989 ) ("the Jia and Anderson publication") disclosed that the resistance of Y—Ba—Cu—O superconductors to degradation by water was improved by a chemical treatment with hydrofluoric acid (HF) solution. Immersion of Y—Ba—Cu—O superconductor in HF was reported to result in a passivation of the surface of the superconductor. According to the Jia and Anderson publication, a thin layer of amorphous fluoride formed on the surface of the Y—Ba—Cu—O during HF treatment which limited later reaction between Y—Ba—Cu—O and water. The layer of amorphous fluoride also limited further reaction between. Y—Ba—Cu—O and HF. According to the Jia and Anderson publication, no noticeable etching occurred after 20 h of immersion of Y—Ba—Cu—O in both bulk and thin-film form in 49 percent HF. In the case of thin films of Y—Ba—Cu—O, the Jia and Anderson publication disclosed that the formation of an amorphous fluoride layer on the surface of the film made electrical measurements difficult. To avoid the effects of the amorphous layer formed during HF treatment under electrical contacts to the Y—Ba—Cu—O thin film, the contacts were evaporated onto the film before the HF treatment and the treatment was carried out with wet HF gas. According to the Jia and Anderson publication, when contact leads for measuring the resistance of a sample of Y—Ba—Cu—O treated with 49 percent HF were connected directly to a surface of the sample, the measured resistance versus temperature curve became unstable due to the formation of fluoride compounds on the sample surface. Scraping the surface layer before introducing the contacts avoided the instability.

It is generally desirable in the photolithographic patterning of multilevel thin-film superconductor/insulator structures for an etchant to exhibit a reasonably low etch rate with respect to the material it is desired to pattern and a high selectivity against etching other materials in the structure. A reasonably low etch rate is in part a matter of convenience but also tends to reduce undercutting under photoresist stencils in cases in which patterns are overetched to ensure that thickness variations are accommodated. Dry etching tends to be better than wet etching for avoiding stencil undercutting. However, the dry etching process of ion milling that has been used for patterning high $T_c$ films has poor selectivity. The poor selectivity of ion milling generally requires that the ion milling system be repeatedly vented for microscopic examination of samples for end point detection. Even so, sample thickness and/or milling rate nonuniformities sometimes preclude achieving satisfactory results over all regions of a wafer. The need for selectivity is particularly great for etching of multilayer thin-film high $T_c$ superconductor/insulator structures because one of the currently preferred methods for thin film deposition, laser ablation, tends to have poor thickness control and uniformity. In addition, the need for selectivity increases as substrate size increases and device geometries get smaller. As is the case for patterning films of high-$T_c$ superconductive materials, there is a need for high selectivity in patterning thin-film insulative materials which are compatible with the superconductive materials. Heretofore, no entirely satisfactory method for etching such insulative materials in the presence of perovskite superconductive materials has been available.

SUMMARY OF THE INVENTION

We have invented a wet chemical process for selectively etching the electrically insulating materials $SrTiO_3$ and MgO relative to the high-$T_c$ perovskite superconductive materials such as $YBa_2Cu_3O_{7-\delta}$ and Tl—Ba—Ca—Cu—O which avoids problems of the prior art noted above. Specifically, we have found that an aqueous solution of hydrogen fluoride can etch both $SrTiO_3$ and MgO at rates significantly faster than the rates at which the solution etches $YBa_2Cu_3O_{7-\delta}$ and Tl—Ba—Ca—Cu—O materials under the same conditions. A preferred aqueous hydrogen fluoride solution can be used, for example, to etch selectively a pattern which passes through a layer of $SrTiO_3$ deposited on a layer of $YBa_2Cu_3O_{7-\delta}$ even in cases in which the thickness of the $SrTiO_3$ layer is not perfectly uniform.

Although aqueous hydrogen fluoride solution of the selective etching process of the subject invention disclosure tends to etch the high-$T_c$ superconductive material $YBa_2Cu_3O_{7-\delta}$ at a substantially slower rate than the rate at which it etches the electrically insulative material $SrTiO_3$, the aqueous hydrogen fluoride solution tends to darken the color of the $YBa_2Cu_3O_{7-\delta}$. The darkening of the $YBa_2Cu_3O_{7-\delta}$ material can be used to advantage as a visual indicator that a covering layer of $SrTiO_3$ has been etched through to an underlying layer of $YBa_2Cu_3O_{7-\delta}$. The dark color may be removed by treating the $YBa_2Cu_3O_{7-\delta}$ with a solution of ethylenediaminetetraacetic acid ("EDTA"). A preferred treatment for removing the dark color is to immerse the darkened $YBa_2Cu_3O_{7-\delta}$ in a saturated aqueous solution of EDTA for a short time. A Tl—Ba—Ca—Cu—O superconductive material is also observed to darken upon exposure to a preferred HF etching solution.

Preferably, the hydrogen fluoride solution in the process of the invention has a concentration in the range of from about 0.5 to about 10 percent by volume. More preferably, the concentration of the hydrogen fluoride solution is in the range from about 2 to about 8 percent by volume. It is particularly preferred to use an approximately 3 volume percent solution of hydrogen fluoride in water.

Preferably, the hydrogen fluoride solution is maintained at a temperature in the range from about 0° to about 70° C. during the etching process of the invention. Most preferably for convenience, the etching process of the invention is carried out with the hydrogen fluoride solution at an ambient room temperature.

A preferred wet etch process of the invention is suitable for patterning insulators for multilayer epitaxial high-$T_c$ superconductor-insulator-superconductor structures down to micron scale dimensions. An etchant solution of approximately 7 percent HF in water by volume gives convenient etch rates for $SrTiO_3$ and MgO insulators. Moreover, etching of thin-film $SrTiO_3$ and MgO insulators with such a preferred etchant solution can be easily stopped on thin-film copper-oxide perovskite superconductive layers, due to a high selectivity of this etchant between the $SrTiO_3$ and MgO insulators and the superconductive materials.

The process of the invention is expected to find wide applicability in fabricating high-$T_c$ superconductive microcircuits such as coils, flux transformers, transmission lines, capacitors, and distributed filter structures. Using entirely wet etching patterning processes, including a preferred wet etching process of the invention, multiturn coils which are superconducting at 87 K have been fabricated.

BRIEF DESCRIPTION OF THE DRAWINGS

Preferred embodiments of the invention are described below with reference to the following drawings.

BEST AND PREFERRED MODES FOR CARRYING OUT THE INVENTION

Strontium titanate $SrTiO_3$ is used as a substrate for thin-film high-$T_c$ copper oxide perovskite superconductive materials and and has been used as a thin-film insulator in multilayer structures involving thin-film perovskite superconductive materials. To demonstrate the etching properties of HF solutions on $SrTiO_3$, test pattern stencils were defined on polished surfaces of single crystalline $SrTiO_3$ substrates using standard lithography and a positive photoresist commercially available from Shipley Company Incorporated of Newton, Mass. under the trade designation "Microposit Photoresist S1818." The photoresist was spun onto the substrate to form a layer roughly 2 μm thick. The substrates bearing the test pattern stencils were then immersed into dilute solutions of hydrogen fluoride HF in water for various times with ultrasonic agitation and subsequently rinsed in deionized water. After removal of the photoresist, the surface profiles were measured with a mechanical stylus.

Figure 1:
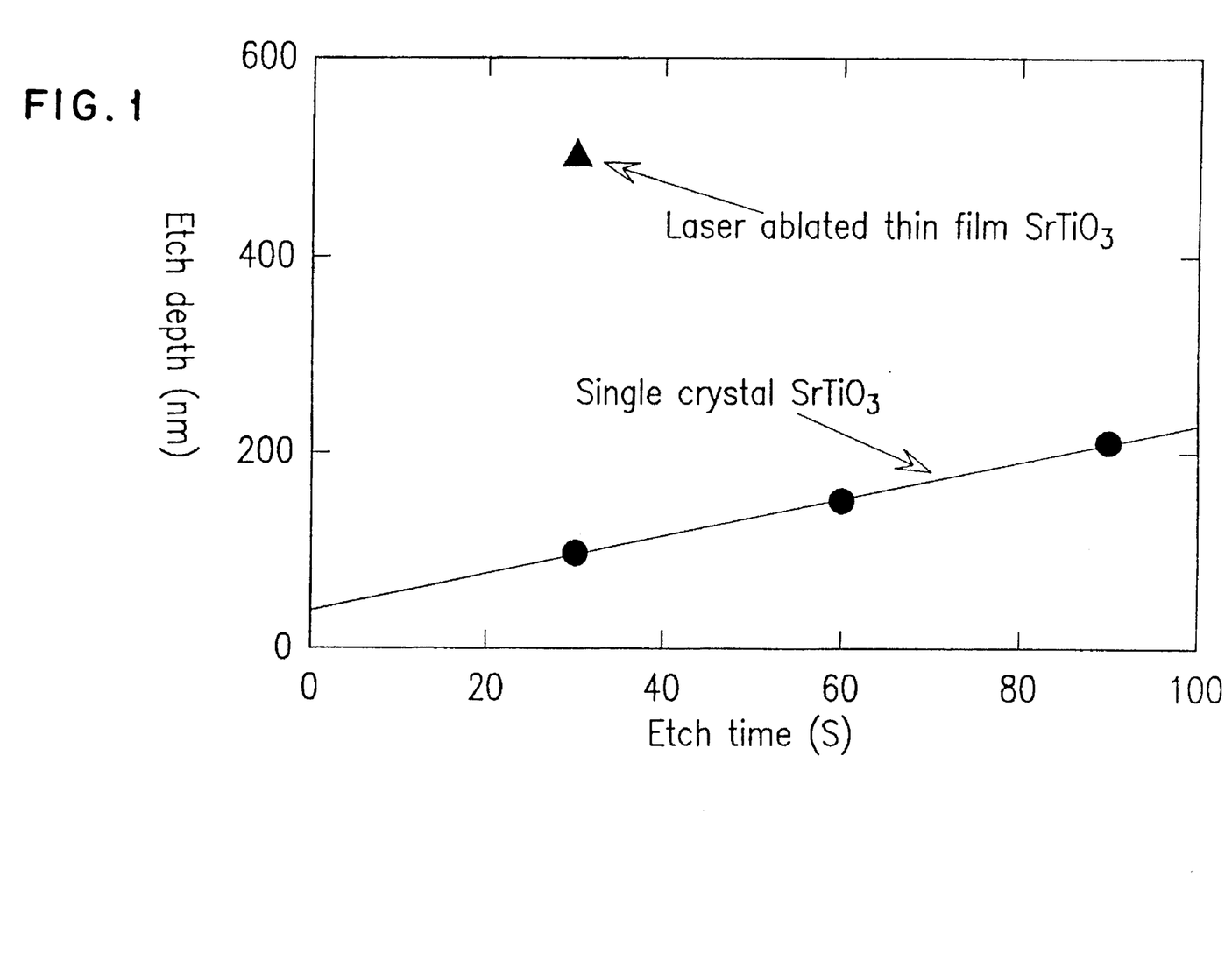
FIG. 1 is a graph of the etched thickness versus etching time for a preferred HF etch of the invention carried out on $SrTiO_3$.

A room temperature solution of approximately seven percent HF by volume in water under ultrasonic agitation gave an etch rate for single crystal SrTiO$_3$ of approximately 1500Å/min, which is convenient for many applications. As shown in the plot of etched thickness versus etching time of FIG. 1, the etch rate appears to be roughly constant after an initial period in which the etch rate is somewhat greater, as evidenced by the fact that the etch depth does not extrapolate through the origin in the graph of FIG. 1. Also shown in FIG. 1 is the etch rate for a thin film layer of laser-deposited SrTiO$_3$. For the thin-film SrTiO$_3$, the etch rate is roughly a factor four to five higher, being approximately 10,000Å/min.

The selectivity in etching SrTiO$_3$ relative to etching high-T$_c$ superconductive materials of the approximately seven percent by volume HF solution in water was determined by similarly patterning thin-film layers of YBa$_2$Cu$_3$O$_{7-\delta}$ and Tl—Ba—Ca—Cu—O with the "Micropoint Photoresist S1818" photoresist and immersing the layers bearing the patterned resist in the etchant at room temperature. The etch rates for these thin film layers were lower than about 200Å/min for the YBa$_2$Cu$_3$O$_{7-\delta}$ and lower than about 1000Å/min for the Tl—Ba—Ca—Cu—O. Thus the etch rate selectivity is greater than ten to one in the least favorable case for the thin films.

Upon exposure to the HF solution, the surfaces of both the YBa$_2$Cu$_3$O$_{x-\delta}$ and Tl—Ba—Ca—Cu—O films were observed to darken. The darkening of the films of superconductive material upon exposure to the HF solution could be used as a convenient etch stop signal. The darkened surface layer tended to be electrically inactive, but it could be removed with a quick dip etch in a saturated aqueous solution of EDTA.

Figure 2:
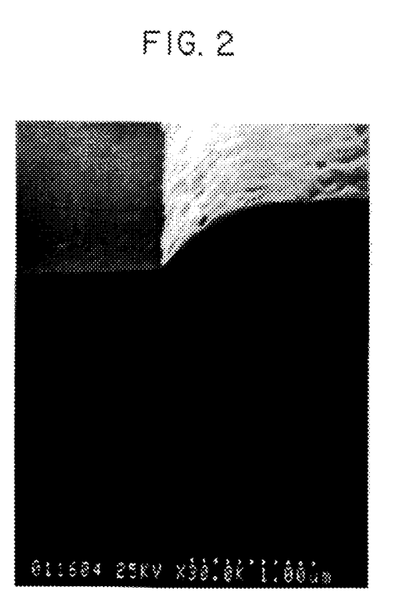
FIG. 2 is a scanning electron micrograph of a line of $YBa_2Cu_3O_{7-\delta}$ etched with a solution of EDTA.
Figure 3:
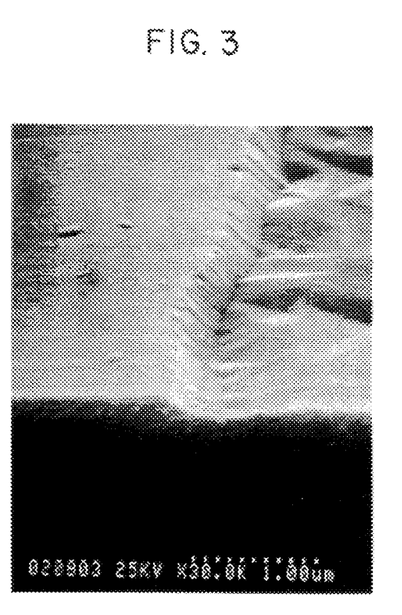
FIG. 3 is a scanning electron micrograph of a line of $SrTiO_3$ etched with a solution of HF.

In contrast to conventional dry etching methods such as ion milling, the preferred wet etching process of the invention tends to yield more gradually tapered edges. Tapered edges are evident in the scanning electron micrographs in FIG. 2 of a YBa$_2$Cu$_3$O$_{7-\delta}$ line defined by EDTA etching and in micrograph of FIG. 3 of a line etched into SrTiO$_3$. Tapered or rounded edges are advantageous for any crossover structures in multilevel thin-film superconductor/insulator/superconductor structures.

Figure 4:
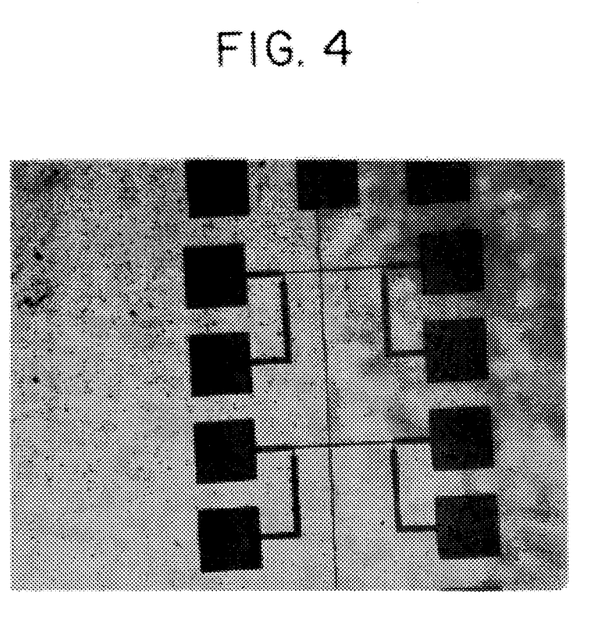
FIG. 4 is a scanning electron micrograph of a test pattern consisting of thin lines of $YBa_2Cu_3O_{7-\delta}$ crossing a wet-etched step of $SrTiO_3$.

To demonstrate the electrical properties of wet etched insulators according to the invention, test structures consisting of thin lines (about 20 μm wide or less) crossing a single wet etched step were examined. Such structures are shown in FIG. 4. The structures were fabricated by the procedure set forth in the following paragraphs.

An approximately 3300Å thick base layer of YBa$_2$Cu$_3$O$_{7-\delta}$ was deposited by laser ablation onto a SrTiO$_3$ substrate. The substrates used were essentially single crystalline SrTiO$_3$ having lateral dimensions of about 6 mm×6 mm. The laser ablation was carried out by focussing a pulsed beam from a frequency tripled Nd:YAG laser on a target of pressed sintered YBa$_2$Cu$_3$O$_{7-\delta}$ maintained at approximately room temperature. The SrTiO$_3$ was attached with silver paint to a heater block maintained at a temperature of about 750° C. The SrTiO$_3$ substrate was positioned with a face oriented toward the YBa$_2$Cu$_3$O$_{7-\delta}$ target and spaced about 55 to 60 mm from the target. The SrTiO$_3$ substrate and the target were located in a deposition chamber which contained approximately 300 mTorr of oxygen. A flow of approximately 100 sccm of oxygen was maintained through the deposition chamber during the deposition. The laser beam was pulsed at an approximately 10 Hz rate and had an energy density of about 5 J/cm$^2$. The laser beam was focussed to an elliptical spot with minor and major axes of about 2 and 3 mm, respectively. The spot was rastered over the surface of the YBa$_2$Cu$_3$O$_{7-\delta}$ target, which was disk-shaped about 25 mm in diameter.

After the deposition of a base layer of YBa$_2$Cu$_3$O$_{7-\delta}$ was completed, the oxygen pressure was increased to about 650 Torr and the coated substrate was cooled to about 450° C. The substrate was maintained at this temperature for about 30 minutes, then cooled to room temperature and removed from the deposition chamber. The YBa$_2$Cu$_3$O$_{7-67}$ base layer had thickness variations of roughly 10 percent over the substrate.

After removal from the deposition chamber, a resist stencil was defined on the base layer of YBa$_2$Cu$_3$O$_{7-\delta}$ on the substrate by standard optical lithography using the commercially available "Microposit S1818" photoresist. The photoresist was spun onto the base layer to a thickness of roughly 2 μm. The YBa$_2$Cu$_3$O$_{7-\delta}$ film bearing the stencil was then immersed in a room-temperature saturated solution of EDTA in water for on the order of five minutes. The EDTA solution was ultrasonically-agitated. The YBa$_2$Cu$_3$O$_{7-\delta}$ base layer was etched by the EDTA solution at a rate of roughly 1200Å/min. After the etching was complete, the photoresist was removed with acetone. An oxygen-plasma clean was then applied to assure complete removal of resist residues. An oxygen-plasma clean carried out for about 5 minutes with an oxygen pressure of about 500 mTorr and a power level of about 100 W applied to an approximately 125-mm diameter disk electrode works satisfactorily to remove resist residues.

Subsequently, an approximately 4000Å thick intermediate lawyer of SrTiO$_3$ was deposited on the patterned. YBa$_2$Cu$_3$O$_{7-\delta}$ laser ablation. The deposition of the SrTiO$_3$ layer was carried out in the same apparatus as the deposition of the YBa$_2$Cu$_3$O$_{7-\delta}$ layer described above. The target sample for the laser deposition was a roughly 25 mm diameter single-crystalline sample of SrTiO$_3$ The substrate heater block was held at about 700° C. during the deposition. The pulse rate and energy density of the laser were essentially the same for the deposition of the SrTiO$_3$ film as for the deposition of the YBa$_2$Cu$_3$O$_{7-\delta}$ film. The oxygen pressure in the deposition chamber was maintained at approximately 300 mTorr during the deposition of the SrTiO$_3$, with a flow rate of approximately 100 sccm through the chamber. After the SrTiO$_3$ film had been deposited, the pressure of the oxygen was increased to about 650 Torr and the temperature of the heater block bearing the coated substrate was reduced to about 450° C. After being held under these conditions for about 30 minutes, the coated substrate was cooled to room temperature.

The sample was then again removed from the deposition chamber and a test pattern resist stencil was defined on the SrTiO$_3$ intermediate layer by essentially the same procedure as used for the base layer of YBa$_2$Cu$_3$O$_{7-\delta}$. The SrTiO$_3$ layer was then etched by an approximately seven percent by volume solution of HF in water. The solution was at room temperature and was ultrasonically agitated. The end point of the HF etching of the SrTiO$_3$ layer was determined when a darkening of the underlying base layer of YBa$_2$Cu$_3$O$_{7-\delta}$ was observed through the openings etched through the SrTiO$_3$ intermediate layer. To render the surface of the underlying YBa$_2$Cu$_3$O$_{7-\delta}$ layer electrically active, the sample was then dipped in a room-temperature saturated aqueous solution of EDTA for about 15 seconds, followed by a rinse in deionized water.

Finally a top layer of YBa$_2$Cu$_3$O$_{7-\delta}$ approximately 4000Å thick was deposited by laser ablation and subsequently patterned by a procedure analogous to the procedure described above for depositing the base layer of $YBa_2Cu_3O_{7-\delta}$.

With the test devices fabricated as described in the preceding paragraphs, the properties of $YBa_2Cu_3O_{7-\delta}$ structures which lay entirely on top of the base layer, structures which crossed the step, and structures which made connections from the top to the base layer via the etched $SrTiO_3$ intermediate layer could be measured. In addition, the electrical isolation of the $SrTiO_3$ intermediate layer could be measured. For lines crossing the single step, the normal/superconductive critical transition temperature $T_c$ (R=0) was measured and found to be about 89 K ±1 K. The electrical isolation of the $SrTiO_3$ layer was found to be larger than about 200 kΩcm below approximately 100 K.

The nature of the top surface of the base layer of thin film $YBa_2Cu_3O_{7-\delta}$ was found to influence the quality of the top layer of thin film $YBa_2Cu_3O_{7-\delta}$ where it crossed over the base layer even though it was separated from the base layer by an intermediate layer of $SrTiO_3$. If the resist-damaged surface layer of the base layer of $YBa_2Cu_3O_{7-\delta}$ was not removed following removal of the resist, the subsequent growth of $SrTiO_3$ deposited on the base layer was found to result in a polycrystalline $SrTiO_3$ film intermediate layer. The polycrystalline $SrTiO_3$ film intermediate layer in turn yielded granular $YBa_2Cu_3O_{7-\delta}$ for the top layer. An oxygen plasma cleaning generally removed the resist-damaged surface layer $YBa_2Cu_3O_{7-\delta}$ and facilitated the growth of relatively high quality $SrTiO_3$ on the $YBa_2Cu_3O_{7-\delta}$ film. Alternatively, the oxygen plasma cleaning could be replaced by a dip into a saturated aqueous solution of EDTA for about 15 seconds, followed by a rinse in deionized water. An oxygen anneal at an oxygen pressure of about 600 Torr at a temperature of about 750° C. in situ for about 10 minutes before the growth of the $SrTiO_3$ layer also proved to be advantageous.

Figure 5:
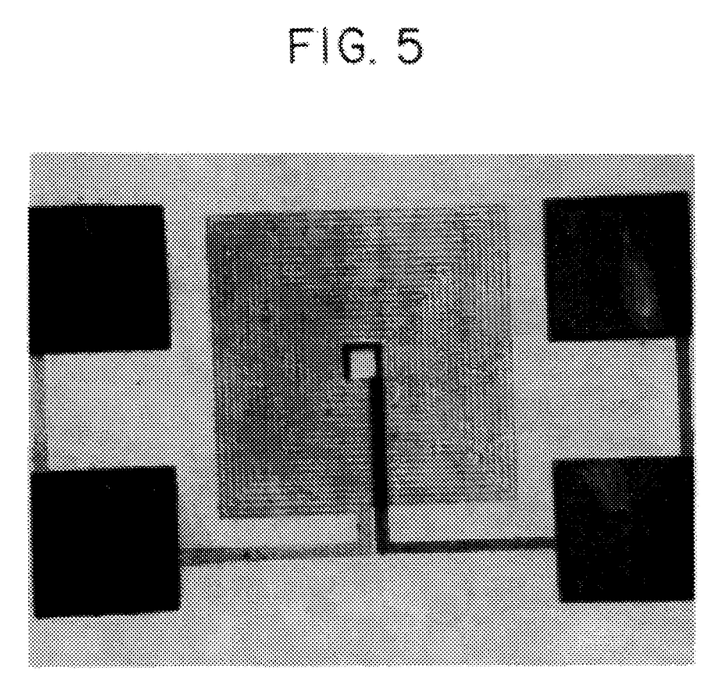
FIG. 5 is an optical micrograph of a twenty-turn coil fabricated from thin-film layers of $YBa_2Cu_3O_{7-\delta}$ and $SrTiO_3$.

FIG. 5 illustrates a twenty-turn input coil for a SQUID which was fabricated by wet-etching methods. The fabrication procedure was generally analagous to the procedure described above for fabricating the single step test structure of FIG. 4. For the twenty-turn coil of FIG. 5, the substrate was single crystalline $SrTiO_3$ with lateral dimensions of about 10 mm×10 mm. For fabricating the coil of FIG. 5, resist layers of about 1 μm were employed. To prepare the thinner resist layers, a positive photoresist commercially available from Shipley Company Incorporated of Newton, Mass. under the trade designation "Microposit Photoresist S1811" was used. For the twenty-turn coil of FIG. 5, the base layer of $YBa_2Cu_3Osub$ 7-δ had a thickness of about about 3000Å; the intermediate layer of $SrTiO_3$ had a thickness of about 3000Å; and the top layer of $YBa_2Cu_3O_{7-\delta}$ had a thickness of about 3800Å. Once the films of $YBa_2Cu_3O_{7-\delta}$ and $SrTiO_3$ had been deposited, the samples were cooled to room temperature without holding for 30 minutes at 450° C. The solution for selectively etching the $SrTiO_3$ intermediate layer had a concentration of about three percent hydrogen fluoride by volume. The coil shown in FIG. 5 has a pitch of about 10 μm with nominal dimensions for lines and spaces being about 5 μm. Minimum dimensions in via hole through the $SrTiO_3$ intermediate layer were approximately 8 μm in the coil structure shown.

Insulator and superconductor films could readily be etched down to about 2 μm dimensions in other test structures. One μm features could also be etched, although demonstrating good control at this dimension often proved to be difficult.

Figure 6:
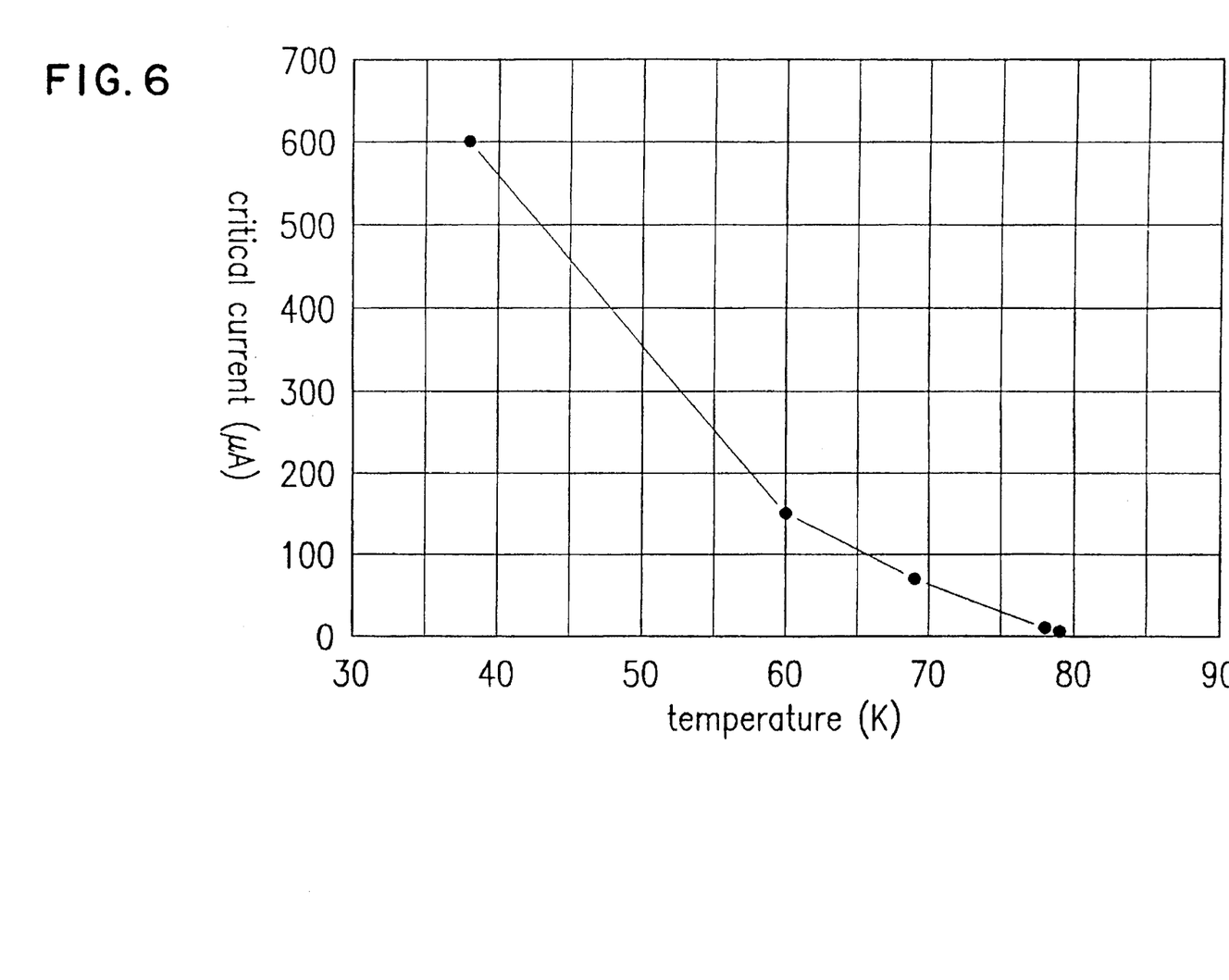
FIG. 6 is a graph of the critical current versus temperature of a twenty-turn coil similar to the the coil shown in FIG 5.

FIG. 6 shows the critical current as a function of temperature for a complete twenty-turn coil similar to the one shown in FIG. 5. The zero-resistance normal superconductive critical transition was found to occur at approximately 79 K. The critical current was approximately 6 μA at 77 K.

Figure 7:
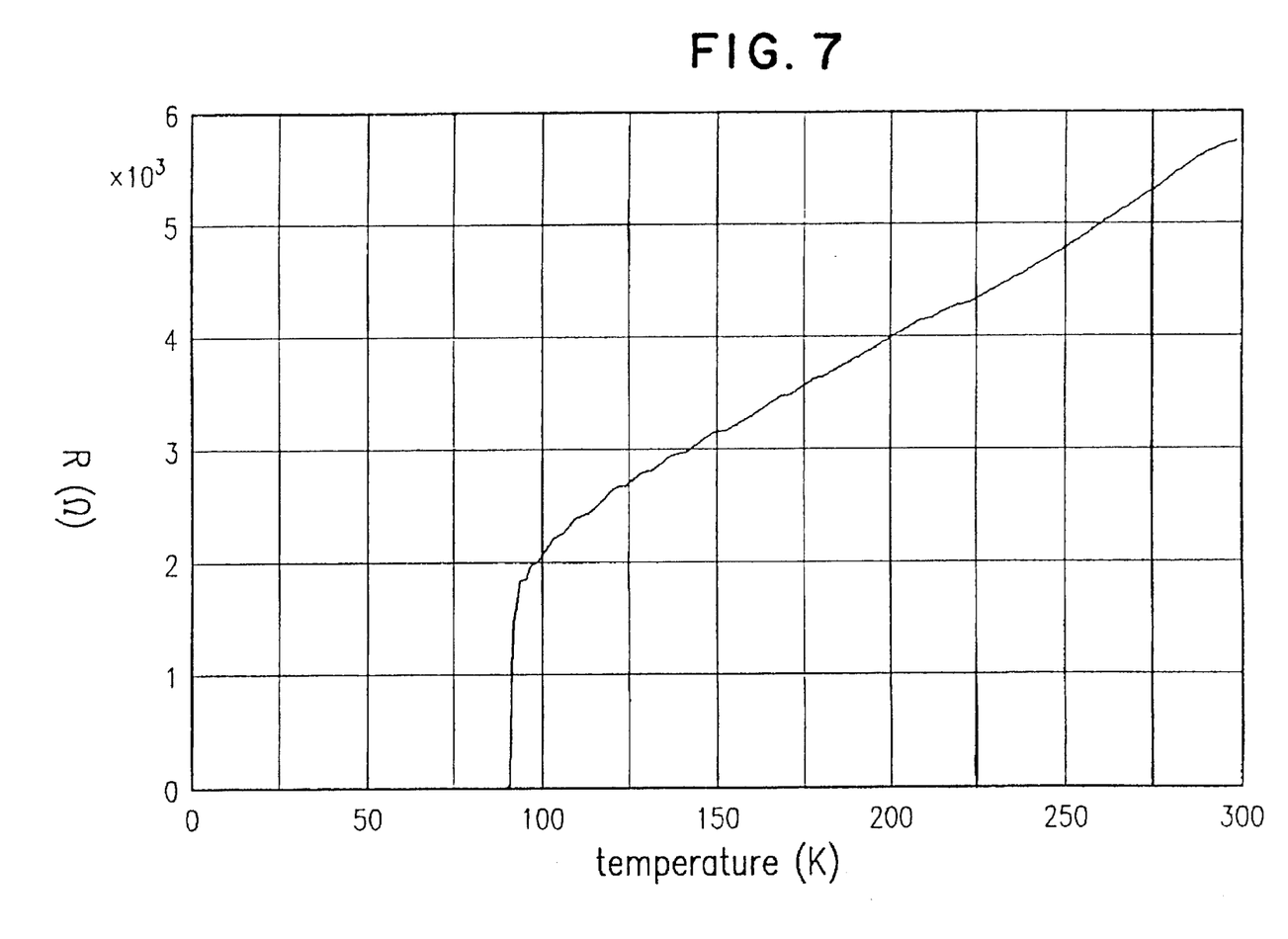
FIGS. 7 and 8 are graphs of the resistance and critical current respectively versus temperature of a complete five-turn coil structurally similar to the twenty-turn coil shown in FIG. 5.
Figure 8:
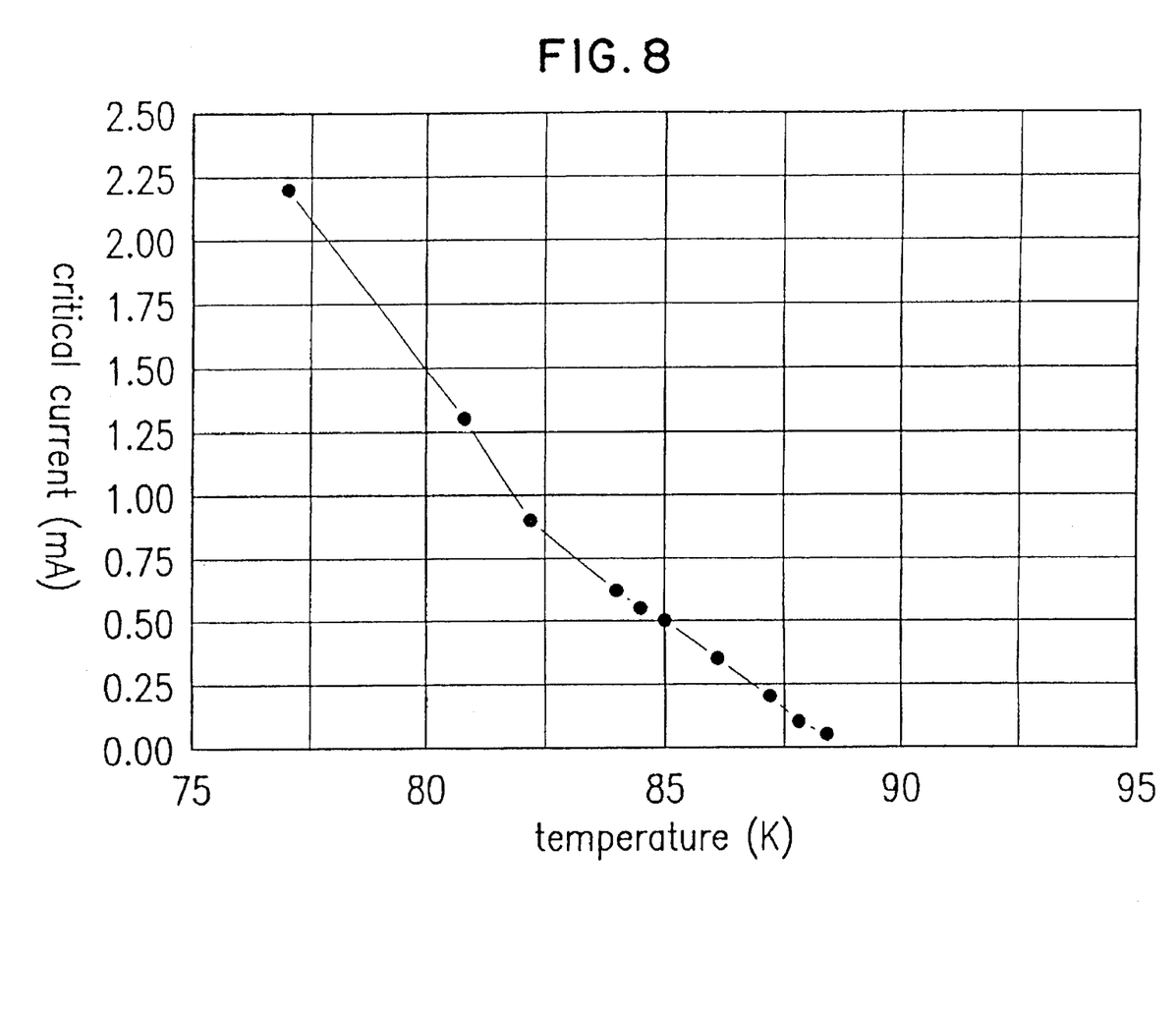

FIG. 7 shows the resistance versus temperature of a five-turn coil generally similar in structure to the twenty-turn coil of FIG. 5. FIG. 8 shows the critical current of the five-turn coil as a function of temperature. The zero-resistance transition of the five-turn coil was about 87 K and the critical current density at 77 K was approximately 2.5 mA. Other five-turn coils of nominally identical structure exhibited resistance at 300 K of between about 2.7 and about 5.7 kΩ and had critical currents at 77 K which varied between about 100 μA and about 2.5 mA. The yield of five-turn coils with zero resistance above 87 K has been as high as about 80 percent.

The value of critical current for the patterned lines is as large as roughly two orders of magnitude below the critical current density of the patterned base layers. The critical currents for the line are more than adequate for many applications, although the variability in the observed critical currents and the reduced critical current values relative to those of the base layer suggests that there may be room for improvement in the quality of the $YBa_2Cu_3O_{7-\delta}$ cross-overs.

The seven percent by volume aqueous HF solution also etches single crystalline MgO at a rate of about 800–1600Å/min at room temperature, which is convenient for many applications. On the other hand, the HF solution does not appear to etch two other insulators that might be used as part of epitaxial device structures: $LaAlO_3$ and $NdGaO_3$.

It is not intended to limit the present invention to the specific embodiments described above. For example, insulative materials other than $SrTiO_3$ and MgO which are etchable by aqueous hydrogen fluoride and are structurally epitaxially compatible to copper oxide perovskite superconductive materials may be employed to advantage in the process of the inventionin certain applications. It is recognized that these and other changes may be made in the processes specifically described herein without departing from the scope and teaching of the present invention, and it is intended to encompass all other embodiments, alternatives, and modifications consistent with the invention.

We claim:

1. A method for selectively etching insulative material composed of $SrTiO_3$ or MgO in the presence of a copper oxide perovskite superconductive material by treating the insulative material with a liquid insulative-material selective etchant solution comprising hydrogen fluoride in water for a period of time defining an etching time period, insulative material being etched away by the etchant solution at an insulative-material etch etched away by the etchant solution at an insulative-material etch rate over the etching time period to remove a quantity of the insulative material, any copper oxide perovskite superconductive material which comes into contact with the etchant solution during the etching time period being etched away by the etchant solution at a superconductive-material etch rate which is substantially lower than the insulative-material etch rate and treating said copper oxide perovskite superconductive material exposed to said liquid insulative material selective etchant with another etchant to remove a surface layer.

2. The method according to claim 1 in which the copper oxide superconductive material is an Y—Ba—Cu—O perovskite superconductive material or a Tl—Ba—Ca—Cu—O perovskite superconductive material and the insulative material is treated with the liquid insulative-material etchant solution by immersion in a bath of the etchant solution.

3. The method according to claim 2 in which the liquid insulative-material-selective etchant solution is a solution of hydrogen fluoride in water having a hydrogen fluoride concentration in the range of from about 0.5 to about ten percent by volume.

4. The method according to claim 3 in which the liquid insulative-material-selective etchant solution has a hydrogen fluoride concentration in the range of from about two to about eight percent by volume.

5. The method according to claim 4 in which the liquid insulative-material-selective etchant solution has a hydrogen fluoride concentration of about three percent by volume.

6. The method according to claim 2 in which the liquid insulative-material-selective etchant solution is maintained at a temperature in the range of from about 0° to about 70° C.

7. The method according to claim 6 in which the etchant solution is maintained at an ambient room temperature.

8. The method according to claim 4 in which the etchant solution is maintained at an ambient room temperature and is ultrasonically agitated.

9. A process for fabricating a multilevel superconductive circuit device comprising the steps of depositing an underlayer film of a copper-oxide perovskite superconductive material on a substrate;

defining an underlayer patterned stencil of a photoresist on the underlayer film by optical lithography;

exposing the underlayer film bearing the underlayer patterned stencil to a liquid perovskite-superconductive-material-selective etchant solution to etch an underlayer pattern in the underlayer film to produce a patterned underlayer film;

removing the underlayer patterned stencil from the patterned underlayer film;

depositing an intermediate layer film of an insulative material on the patterned underlayer film, the insulative material being $SrTiO_3$ or MgO;

defining an intermediate-layer patterned stencil of a photoresist on the intermediate-layer film by optical lithography;

exposing the intermediate-layer film bearing the intermediate-layer stencil to a liquid insulative-material-selective etchant solution for a period of time defining an etching time period to etch the intermediate layer film of insulative material overlying the patterned underlayer film, the insulative material-selective etchant solution comprising a solution of hydrogen fluoride in water, insulative material being etched away by the etchant solution at an insulative-material etch rate over the etching time period to remove a quantity of the insulative material, any copper oxide perovskite superconductive material, any copper oxide perovskite superconductive material which comes into contact with the etchant solution during the etching time period being etched away by the etchant solution at a superconductive-material etch rate which is substantially lower than the insulative-material etch rate;

removing the intermediate-layer-patterned stencil from the patterned intermediate layer film;

depositing an overlayer film of the copper-oxide perovskite superconductive material on the patterned intermediate-layer film of insulative material;

defining an overlayer patterned stencil of a photoresist on the overlayer film by optical lithography;

exposing the overlayer film bearing the overlayer patterned stencil to a liquid perovskite-superconductive-material selective etchant solution to etch an overlayer pattern in the overlayer film to produce a patterned overlayer film overlying the patterned intermediate-layer film;

removing the overlayer patterned stencil from he patterned overlayer film; and treating said copper oxide perovskite superconductive material exposed to said liquid insulative material selective etchant with another etchant to remove a surface layer.

10. The process according to claim 9 in which the copper oxide superconductive material is an Y—Ba—Cu—O perovskite superconductive material or a Tl—Ba—Ca—Cu—O perovskite superconductive material and each of the underlayer, intermediate-layer, and overlayer films is exposed to the respective selective etchant solution by immersion in a bath of the respective etchant solution.

11. The process according to claim 10 in which the insulative-material selective etchant solution is a solution of hydrogen fluoride in water having a hydrogen fluoride concentration in the range of from about 0.5 to about ten percent by volume.

12. The process according to claim 11 in which the insulative-material selective etchant solution has a hydrogen fluoride concentration in the range of from about two to about eight percent by volume.

13. The process according to claim 12 in which the insulative-material selective etchant solution has a hydrogen fluoride concentration of about three percent by volume.

14. The process according to claim 10 in which the insulative-material selective etchant solution is maintained at a temperature in the range of from about 0° to about 70° C.

15. The process according to claim 14 in which the insulative-material selective etchant solution is maintained at an ambient room temperature.

16. The process according to claim 12 in which the insulative-material selective etchant solution is maintained at an ambient room temperature and is ultrasonically agitated.

17. A method for selectively etching an insulative material in the presence of a copper oxide perovskite material, the insulative material having a lattice structure which is epitaxially structurally compatible with a lattice structure of the copper oxide perovskite superconductive material, said insulative material being hydrogen-fluoride etchable, by treating the insulative material for a period of time defining an etching time period with a liquid insulative-material selective etchant solution comprising hydrogen fluoride in water in the presence of the copper oxide perovskite superconductive material, insulative material being etched away by the etchant solution at an insulative-material etch rate over the etching time period to remove a quantity of the insulative material, any copper oxide perovskite superconductive material which comes into contact with the etchant solution during the etching time period being etched away by the etchant solution at a superconductive-material etch rate and treating said copper oxide perovskite superconductive material exposed to said liquid insulative material selective etchant with another etchant to remove a surface layer.

18. The method according to claim 17 in which the insulative material is $SrTiO_3$ or MgO.

19. A process for fabricating a multilevel superconductive circuit device comprising the steps of depositing an underlayer film of a copper-oxide perovskite superconductive material on a substrate;

defining lithographically an underlayer patterned stencil of a photoresist on the underlayer film;

exposing the underlayer film bearing the underlayer patterned stencil to a perovskite-superconductive-material etchant to etch an underlayer pattern in the underlayer film to produce a patterned underlayer film;

removing the underlayer patterned stencil from he patterned underlayer film;

depositing an intermediate layer film of an insulative material on the patterned underlayer film, the insulative material being $SrTiO_3$ or MgO;

defining lithographically an intermediate-layer patterned stencil of a photoresist on the intermediate-layer film;

exposing the intermediate-layer film bearing the intermediate-layer to a liquid insulative-material-selective etchant solution for a period of time defining an etching time period to etch the intermediate layer film of insulative material overlying the patterned underlayer film, the insulative material-selective etchant solution comprising a solution of hydrogen fluoride in water, insulative material being etched away by the etchant solution at an insulative-material etch rate over the etching time period to remove a quantity of the insulative material, any copper oxide perovskite superconductive material which comes into contact with the etchant solution during the etching time period being etched away by the etchant solution at a superconductive-material etch rate which is substantially lower than the insulative-material etch rate;

removing the intermediate-layer-patterned stencil from the patterned intermediate layer film;

depositing an overlayer film of the copper-oxide perovskite superconductive material on the patterned intermediate-layer film of insulative material;

defining lithographically an overlayer patterned stencil of a photoresist on the overlayer film;

exposing the overlayer film bearing the overlayer patterned stencil to a perovskite-superconductive-material etchant to etch an overlayer pattern in the overlayer film to produce a patterned overlayer film overlying the patterned intermediate-layer film;

removing the overlayer patterned stencil from the patterned overlayer film; and treating said copper oxide perovskite superconductive material exposed to said liquid insulative material selective etchant with another etchant to remove a surface layer.

20. The process according to claim 19 in which the copper oxide superconductive material is an Y—Ba—Cu—O perovskite superconductive material or a Tl—Ba—Ca—Cu—O perovskite superconductive material and each of the underlayer, intermediate-layer, and overlayer films is exposed to the respective etchant by immersion in a bath of the respective etchant solution.

21. The process according to claim 20 in which the insulative-material selective etchant solution is a solution of hydrogen fluoride in water having a hydrogen fluoride concentration in the range of from about one-half to about ten percent by volume.

22. The process according to claim 21 in which the insulative-material selective etchant solution has a hydrogen fluoride concentration in the range of from about two to about eight percent by volume.

23. The process according to claim 22 in which the insulative-material selective etchant solution has a hydrogen fluoride concentration of about three percent by volume.

24. The process according to claim 20 in which the insulative-material selective etchant solution is maintained at a temperature in the range of from about 0° to about 70° C.

25. The process according to claim 24 in which the insulative-material selective etchant solution is maintained at an ambient room temperature.

26. The process according to claim 22 in which the insulative-material selective etchant solution is maintained at an ambient room temperature and is ultrasonically agitated treating said copper oxide perovskite superconductive material exposed to said liquid insulative material selective etchant with another etchant to removed a surface layer.

* * * * *